United States Patent [19]

Sakurai

[11] Patent Number: 5,079,607
[45] Date of Patent: Jan. 7, 1992

[54] MOS TYPE SEMICONDUCTOR DEVICE

[75] Inventor: Kenya Sakurai, Matumoto, Japan

[73] Assignee: Fuji Electric Co., Ltd., Japan

[21] Appl. No.: 630,065

[22] Filed: Dec. 19, 1990

[30] Foreign Application Priority Data

Dec. 22, 1989 [JP] Japan ............................ 1-333762

[51] Int. Cl.$^5$ .............................. H01L 29/78
[52] U.S. Cl. ........................ 357/23.7; 357/15; 357/43; 357/55; 357/68; 357/23.4
[58] Field of Search ............ 357/23.4, 23.7, 15, 357/43, 55, 68

[56] References Cited

U.S. PATENT DOCUMENTS 4,809,045  2/1989  Yilmaz .................... 357/23.4

OTHER PUBLICATIONS

IEEE, IEDM Technical Digest, 4 (1983) pp. 79 to 82, Dec. 1983.
IEEE, Trans. Electron. Devices, ED-31 (1984) pp. 1790 to 1795, Dec. 1984.
IEEE Trans. Electron. Devices, ED-32 (1985) p. 2554, Nov. 1985.
IEDM (1987 year International Electron Devices Meeting proceedings) p. 674, Dec. 1987.

*Primary Examiner*—Edward J. Wojciechowicz
*Attorney, Agent, or Firm*—Brumbaugh, Graves, Donohue & Raymond

[57] ABSTRACT

A metal oxide semiconductor device comprising a semiconductor substrate having a semiconductor layer of a first conductivity type disposed thereon. A plurality of first regions of a second conductivity type are disposed on and embedded in a first surface of the semiconductor layer of the first conductivity type, and a plurality of second regions of the first conductivity type disposed on the first surface of the semiconductor layer between said first regions. In addition, a plurality of MOSFET structures are disposed on the surface of the semiconductor layer each structure comprising an insulating film disposed on the semiconductor layer extending over portions of two of the first regions and having an opening aligned with the second region disposed between said two first regions, a single crystal semiconductive layer of the second conductivity type disposed on the insulating film, one or more source regions of the first conductivity type disposed on and embedded the single crystal semiconductor layer, one or more drain regions of the first conductivity type disposed on and embedded the single crystal semiconductor layer at a location closer to the opening than said source region, a second insulating film disposed on the surface of the single crystal semiconductive layer, a gate electrode disposed on the insulating film, a first electrode making electrical contact between the drain region and the second region through an opening in the first insulating film, and a second electrode making electrical contact between the source region and the first region.

8 Claims, 5 Drawing Sheets

MOS TYPE SEMICONDUCTOR DEVICE

FIELD OF THE INVENTION

The present invention relates to a MOS device in which voltage control of current passing between one surface of a semiconductor substrate of the MOS device and another surface of the semiconductor substrate of the MOS device is made possible by utilizing the MOS structure.

BACKGROUND OF THE INVENTION

In recent years, there has been an increased demand for electrical switching elements which are capable of operating at higher operating speeds and which have higher breakdown voltages. To satisfy these demands, a vertical type power MOSFET, in which current between the two main surfaces of the semiconductor substrate is controlled by a plurality of MOS structures, has been developed primarily for use as a switching element for power supplies. A conductivity modulating type MOSFET, also known as an insulated gate bipolar transistor (IGBT), has made it possible to reduce the ON resistance of the MOSFET by utilizing conductivity modulation and its use will broaden to inverter control in situations where higher break down voltages and higher electric power is required.

FIG. 2 shows a cross-sectional view of an n-type channel IGBT. In FIG. 2, there is an $n^-$ drift region 2, overlying $p^+$ collector region 1. A p base region 3 is selectively formed on the surface of the $n^-$ drift region 2. On the surface of the p base region 3 two $n^+$ source regions 4 are formed. Centrally formed between the two $n^+$ regions 4 and deeper into the $n^-$ region 2 than the p base region 3, is a $p^+$ well 5. In order to form an $n^-$ type channel on the p base region 3 between the $n^+$ region 4 and the extruded portion of the $n^-$ region 2, a gate electrode 7, connected to a gate terminal G, is formed in an insulating film 6. In the contact hole formed between regions of the insulating film 6, an emitter electrode 8 is connected to the emitter terminal E and is in contact to both the p well 5 and the $n^+$ source region 4. Connected to the $p^+$ collector region 1 is a collector electrode 9 which is connected to a collector electrode C.

When a positive voltage is applied to the gate terminal G and the collector terminal C, and the emitter terminal E is connected to ground, the surface of the p base region 3 under the gate 6 is inverted and an $n^-$ type channel is formed by the same principles of operation as in the formation of an electron channel in a MOSFET.

As a result of the formation at the $n^-$ type channel, the $n^-$ drift region 2 is effectively connected to the ground potential, and a positive hole current is injected from the $p^+$ collector region 1. In effect, the injection of minority carriers (positive holes) occurs in the $n^-$ drift region 2 because it is the high resistance region. Since the injection of the minority carriers satisfies the electric charge neutralizing conditions, the concentration of electrons, as the majority carriers, increases, and the resistance of the $n^-$ region decreases to a large extent, by the so called conductivity modulation effect.

FIG. 3 shows the structure of an $n^-$ type channel power MOSFET. This MOSFET is provided with an $n^-$ region 21 as the drain region instead of the $p^+$ collector region 1 of the IGBT of FIG. 2, and has a $n^-$ region laminated thereon. The p base region 3, $n^+$ source region 4, and p well region 5 are formed in the $n^-$ region 22. Gate electrode 7 is connected to the gate terminal G and is positioned on a surface area 31 overlaying the $n^-$ drain region 22, the base region 3 and the source region 4 via an insulating film 6, in the same manner as is shown in FIG. 2. In FIG. 3, a source electrode 28 is connected to the source terminal S and a drain electrode 29 is connected to the drain terminal D. These connections correspond to the emitter electrode 8 and the collector electrode 9 of the IGBT shown in FIG. 2, respectively.

In the IGBT, the emitter current is represented as $I_e = I_h + I_{MOS}$, where $I_h$ denotes the positive hole current and $I_{MOS}$ denotes the electron current. If the current gain of a pnp transistor 41 (FIG. 4), comprising the p base region 3, $n^-$ drift region 2, and $p^+$ collector region 1, is represented as $\alpha_{PNP}$, the positive hole current is equal to:

$$I_h = \left( \frac{\alpha_{PNP}}{1 - \alpha_{PNP}} \right) I_{MOS}$$

Thus, $I_E$ is equal to:

$$I_e = \left( \frac{1}{1 - \alpha_{PNP}} \right) I_{MOS}$$

As a result of changes in the $\alpha_{PNP}$ value, the current $I_h$ changes, which effectively means that the current of the IGBT changes.

FIG. 5 shows a representative switching waveform in the case of a turn off, and it is known that there exist a first phase 51 and a second phase 52. In the first phase 51, the channel disappears and the electron current becomes zero, causing the current to decrease instantly for that extent. In the second period, current resulting from the action of the carrier remaining in the $n^-$ region the $pn^-p^+$ bipolar transistor is decreased by the recombination of carriers at the characteristic lifetime $\tau$ of the carrier in the open base state. Therefore, this region is determined by the injection level of the positive hole current or the carrier lifetime $\tau$. Presently, techniques used to make the element operable at higher frequencies include the control of the injection level of positive hole current by the formation of a buffer $n^+$ layer between the $p^+$ substrate and the $n^-$ high resistance region (cf. IEEE, IEDM Technical Digest, 4. (1983) pp. 79 to 82), the control of the concentration of the $p^+$ substrate, or the reduction of carrier lifetime $\tau$ by a lifetime control process, i.e., electron irradiation or heavy metal diffusion. (cf. IEEE, Trans. Electron, ED-31 (1984) pp. 1790 to 1795).

In present IGBTs, there is a further inherent problem. As shown in FIG. 4, there exists an additional parasitic npn bipolar transistor 42, comprising $n^+$ source region 4, p base region 3, and $n^-$ drift region 2, in addition to the pnp parasitic bipolar transistor 41. These parasitic bipolar transistors respectively have the current gain $\alpha_{NPN}$ and $\alpha_{PNP}$, and as a result, are in the pnp thyrister structure. When the sum of the respective current gains becomes equal to or greater than 1, a phenomenon in which the thyrister is in the ON state, that is, a latch up, is generated. When the latch up is generated, the IGBT loses gate control of the current, and subsequently reaches breakdown. The catastrophic failure that is, the latch up break down, is one of the important problems in the IGBT, especially when used as for inventor control applications.

In the electric power MOSFET, the source region 4, base region 3, and drain region 22 form a parasitic npn bipolar transistor 42. One reason for the activation of this parasitic transistor is the flow of a large number of carriers through the base region 3 directly under the source region 4 to the source electrode 28. This flow of carriers generates a voltage drop along the source base connecting part of the power MOSFET. When the voltage drop exceeds the threshold voltage value of about 0.7 V, this junction is biased in the forward direction causing the parasitic bipolar transistor to be turned on. This makes the control of the MOSFET current through the use of the gate signal impossible, due to the gate signal causing the MOSFET to break down. This is the so-called latch back phenomenon.

As described above and shown in FIGS. 3 and 4, the IGBT and the insulating gate type MOSFET contain respectively, a parasitic pnp thyrister and a parasitic npn transistor. These parasitic elements lead to the sudden latch up or latch back phenomenon, especially at high voltage, high electric current, and high temperature, and make the gate control function lost because of the element's destruction. In order to prevent the activation of respective parasitic transistors and hence, prevent the latch up and latch back phenomena in the conventional IGBT and insulating gate type MOSFET, such measures as the reduction of the base resistance of the p well 5 (cf. IEEE Trans. Electron. Devices, ED-32 (1985) p. 2554), the reduction of majority carries in the p base layer, and the reduction of the electric current concentrating necessary to access to the emitter and base junction parts of the element (cf. US. Pat. No. 4,809,045), have been used. Also, in recent years, by the application of a trench gate structure (cf. IEDM (1987 year International Electron Devices Meeting proceedings) p. 674) and the like, it has been reported that the latch up resistance of the IGBT has been improved to a great extent. At any rate, there exists the latching phenomenon, and when an abnormality such as, for example, a short circuit during use or a fluctuation in the wafer production process, is considered, it is natural for latch up free and latch back free devices to be desired. Thus, for example, with respect to short circuit capability, the IGBT available in today's market is by far inferior when compared with the conventional bipolar power transistor.

In addition, the above described methods for improving the latching phenomenon have the negative trade off of causing an increase in the ON voltage of the IGBT and the power MOSFET.

An object of the present invention is to solve these problems, and to provide a high performance MOS type semiconductor device in which the parasitic thyrister and parasitic transistor structures are omitted, and the latching phenomenon which has high short circuit capability is not present, but has low ON voltage independently of the short circuit capability.

SUMMARY OF THE INVENTION

In order to attain the above-described object, the present invention uses a metal oxide semiconductor device comprising a semiconductor substrate having a semiconductor layer of a first conductivity type disposed thereon. A plurality of first regions of a second conductivity type, different from said first conductivity type, are disposed on and embedded in a first surface of the semiconductor layer of the first conductivity type, and a plurality of second regions of the first conductivity type having high impurity concentration are disposed on the first surface of the semiconductor layer of the first conductivity type between adjacent ones of said first regions. In addition, a plurality of MOSFET structures are disposed on the surface of the semiconductor layer each structure comprising an insulating film disposed on the semiconductor layer of the first conductivity extending over portions of two of the first regions and having an opening aligned with the second region disposed between said two first regions, a single crystal semiconductive layer of the second conductivity type disposed on the insulating film on both sides of the opening, one or more source regions of the first conductivity type disposed on and embedded within a first surface of the single crystal semiconductor layer on either side of the opening near the edge of the single crystal layer remote from the opening, one or more drain regions of the first conductivity type disposed on and embedded within the first surface of the single crystal semiconductor layer at a location closer to the opening than said source region, a second insulating film disposed on the surface of the single crystal semiconductive layer and making contact with at least some portions of the single crystal semiconductive layer, the source region and the drain region while leaving portions of the source an drain regions exposed, a gate electrode disposed on the insulating film, a first electrode making electrical contact between the exposed portion of the drain region and the second region through the opening in the first insulating film, and a second electrode making electrical contact between the exposed portion of the source region and the first region.

DETAILED DESCRIPTION OF THE PREFERRED EMBODIMENT

Figure 1:
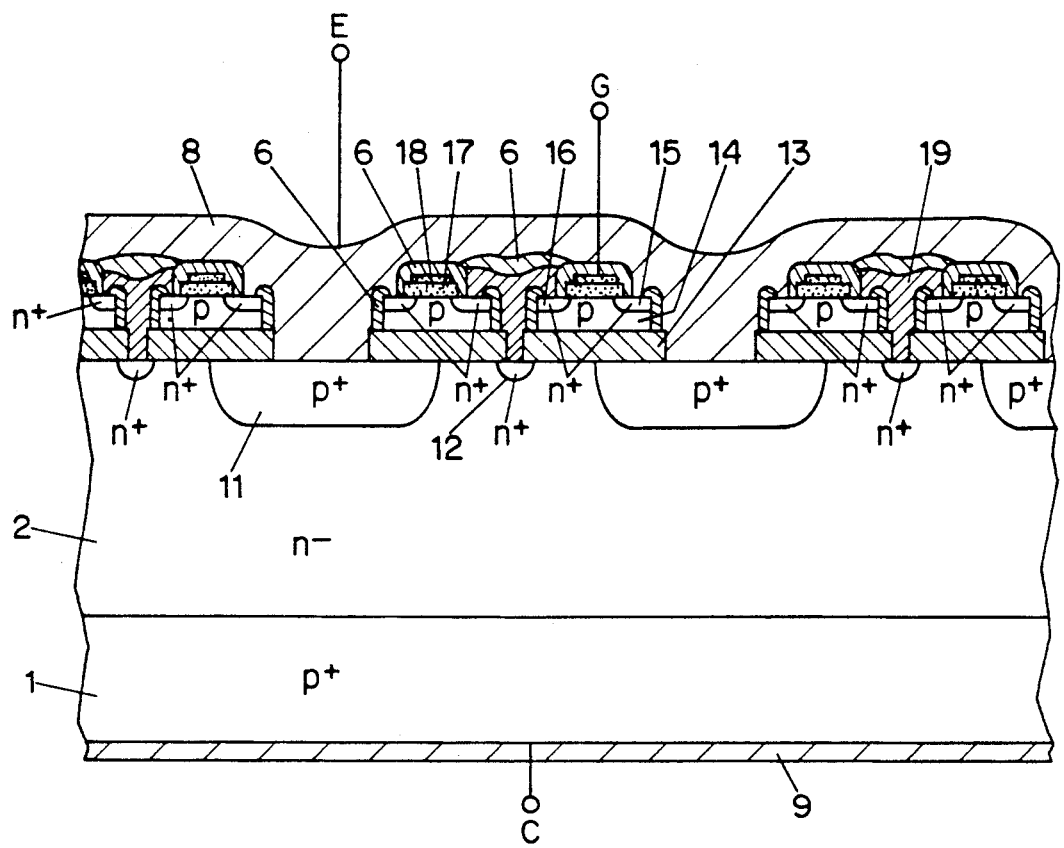
FIG. 1 is a sectional view of the essential part of the IGBT of an embodiment of the present invention.
Figure 2:
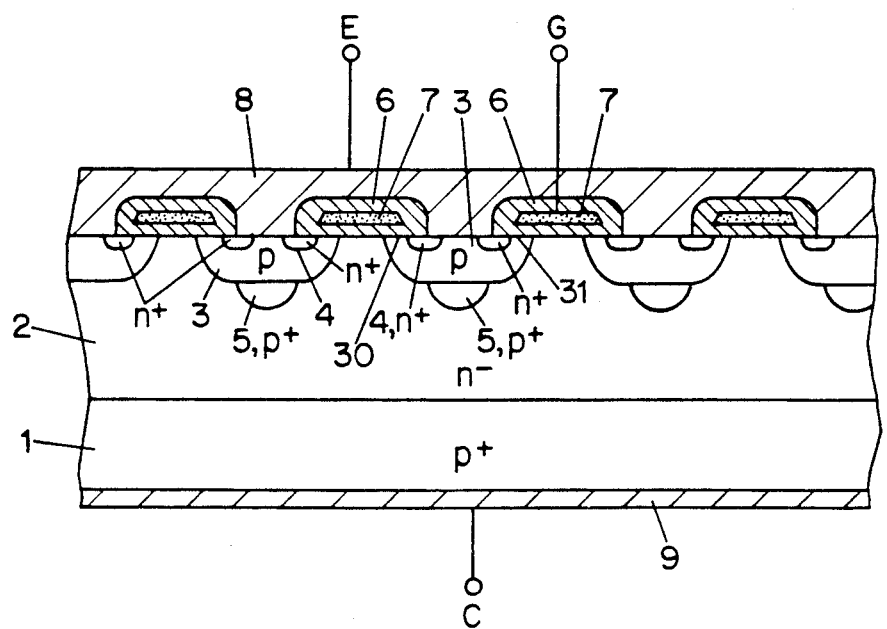
FIG. 2 is a sectional view of the essential part of a conventional IGBT.

FIG. 1 shows an IGBT of the present invention. Areas common to FIG. 1 and FIG. 2 have common numbers. In FIG. 1, $p^+$ diffusion regions 11 and $n^+$ diffusion regions 12 are formed on the surface of the $n^-$ drift region 2. An insulating film 13 which consists of a comparatively thick oxide film, is formed on the surface $n^-$ drift region 2, overlaying portions of adjacent $p^-$ regions 11 and the $n^+$ region 12 between the $p^-$ region. A p type single crystal silicon layer 14 is formed over the insulating film. At both ends of the p type single crystal silicon layer 14, n+ diffusion regions 15 and 16 are formed. The single crystal silicon layer can be formed by laser irradiation after the deposit of a poly crystalline silicon layer. The n+ region 15 is a source region and n+ region 16 is a drain region, and on the surface therebetween, a gate electrode 18 is provided via a gate oxide film 17. The emitter region 11 is in contact with the emitter electrode 8 which is connected to the emitter terminal E and the source region 15. The n+ diffusion region 12 is connected with drain region 16 and drain electrode 19. Between emitter electrode 8 and drain electrode 19 there is an inner layer insulating film 6.

Figure 6:
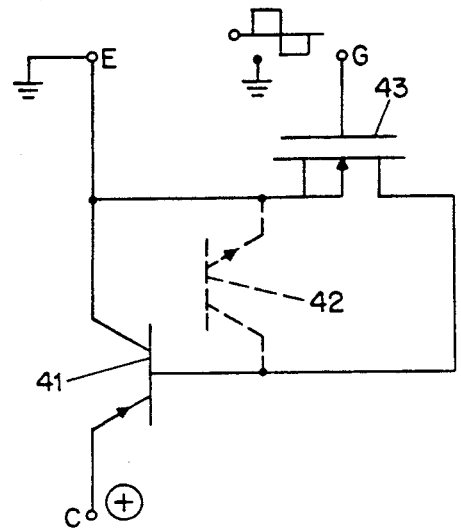
FIG. 6 is an equivalent circuit diagram of the IGBT of FIG. 1.

FIG. 6 shows an equivalent circuit diagram of the IGBT shown in FIG. 1. The pnp bipolar transistor 41 is formed by p+ region 1, n− region 2 and p+ region 11. The n channel MOSFET 43 consists of p layer 14, n+ layers 15 and 16, gate oxide film 17, and gate electrode 18. This element applies positive voltage to the collector terminal C, and the emitter terminal E is at the ground potential, and when a square wave of + and − direction has been applied between the gate terminal G and the emitter terminal E, a switching action is carried out. When a positive voltage is applied to the gate terminal, and the voltage exceeds the threshold voltage, as determined by the thickness of the gate oxide film 17, the concentration of the Si layer 14, and the length between the source and drain regions 15 and 16, an n type inversion layer, the so-called n channel, is formed underneath the gate electrode 18. This causes, the MOSFET to be turned on, and electron current flows into the n− drift region 2 from the emitter electrode 8 by way of source region 15 and drain electrode 19. In effect, base current can be considered to have been supplied to the pnp bipolar transistor 41. Therefore, injection of positive hole current is started from the p+ collector region 1 into the n− drift region 2. The injection of this minority carrier generates conductivity modulation, and makes a low ON voltage possible. These injected positive holes reach the p+ emitter region 11, while they are recombining with electrons in the base region 2. Consequently, the emitter current $I_E$ of the present element becomes the sum of the positive hole current $I_h$ and the electron current $I_e$ of the MOSFET 43 ($I_E = I_h + I_e$).

In the conventional n channel IGBT, latch up destruction due to the turn on phenomenon of the parasitic transistor is caused by the voltage drop resulting from the transverse crossing of the resistive component directly under the source region by the positive hole current, as previously described. In the element of the present invention, no parasitic transistor 42 is present in the p+ diffusion region 11, and the latch up phenomenon cannot occur. On the other hand, in the case when it is turned off, the MOSFET 43 is turned off to stop the supply of the base current to the bipolar transistor 41. The minority carrier accumulated in the n− region 2 is damped by the recombination process. The majority carriers are damped by the recombination or the reverse injection into the p+ emitter 11. Thereafter, as the voltage increases the depletion layer spreads from the respective p+ emitter region 11. However, since the n+ region 12 is present between the p+ emitter region 11, the depletion layer does not elongate on the n+ surface. In effect, with an increase in voltage, the electric field at the n− region 12 increases. When the depletion layers elongate from the neighboring p− emitter region 11 overlaps in the n− drift region 2 directly below the n+ diffusion region 12 between the p+ emitter region 12 the n+ region 12 is perfectly buried in the depletion region, and all the increase in voltage thereafter is preserved by the elongation of the depletion layer in the n− drift region 2. In the case where the resistance value of the n− drift region is comparatively high (above 50 L cm), the above-described situation can be easily attained, and a power device of more than 1000 V class is possible.

In the structure of FIG. 1, although the emitter electrode 8 is separated from the drain electrode 19 by the interlayer insulating film 6, it is of course possible to make it in a stripe structure, in which the interlayer insulating film is not used, a comb teeth structure, or a variation thereof.

Figure 7:
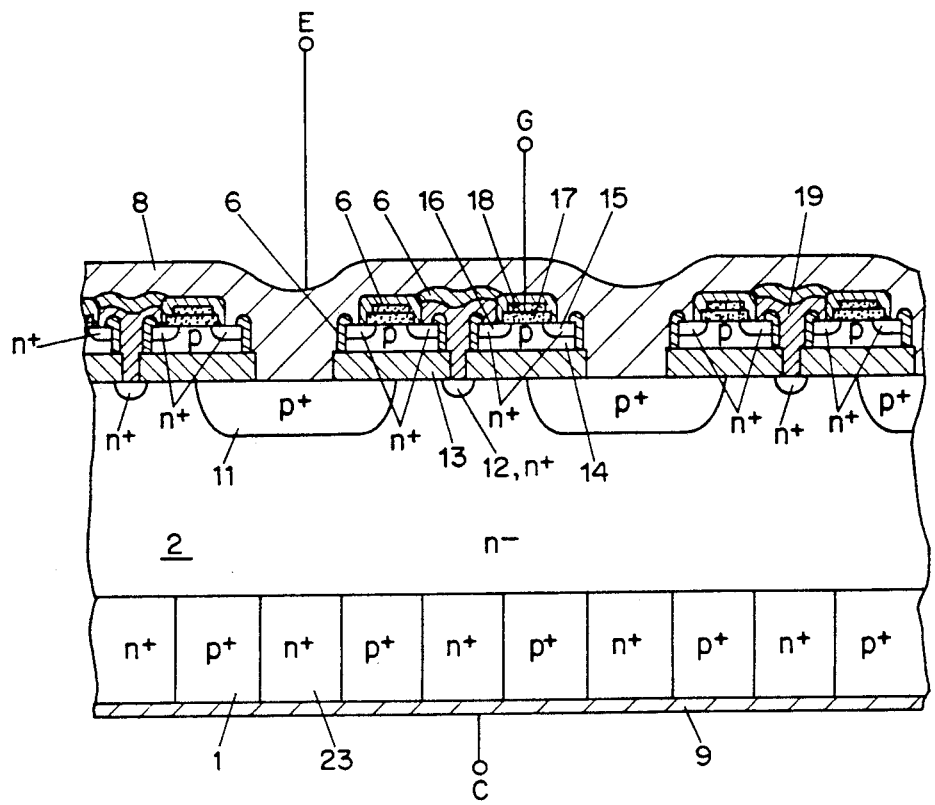
FIGS. 7, 8, and 9 are respectively the sectional views of the essential part of an IGBT having different embodiments of the present invention.
Figure 8:
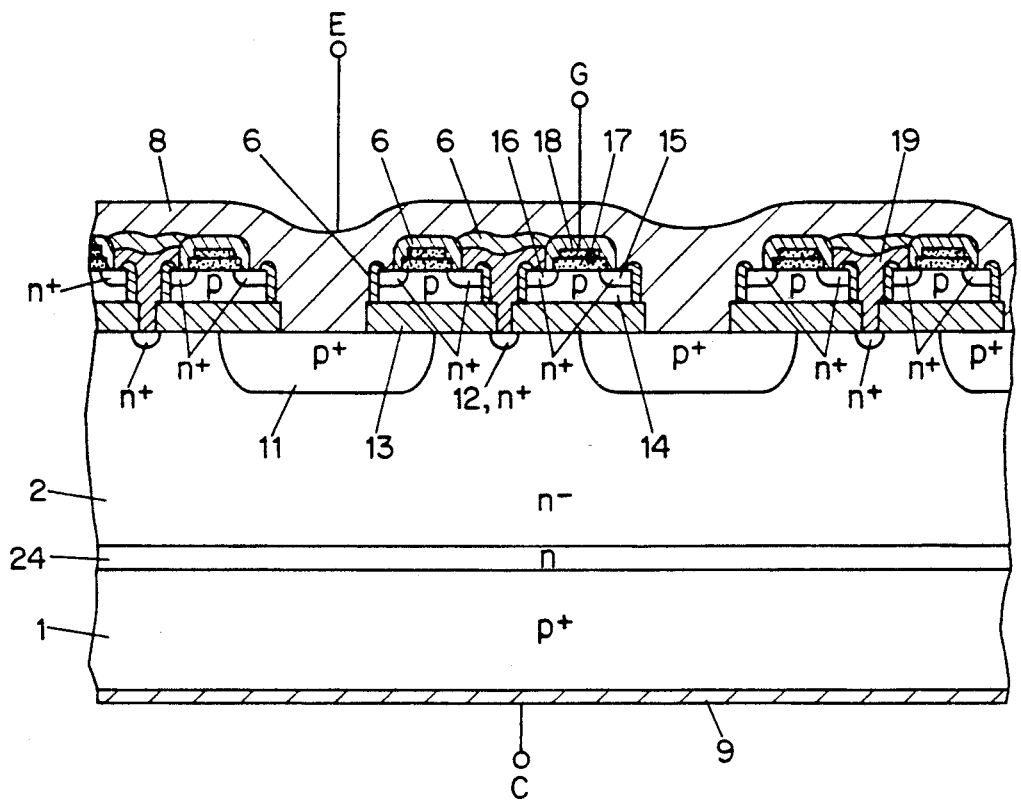
Figure 9:
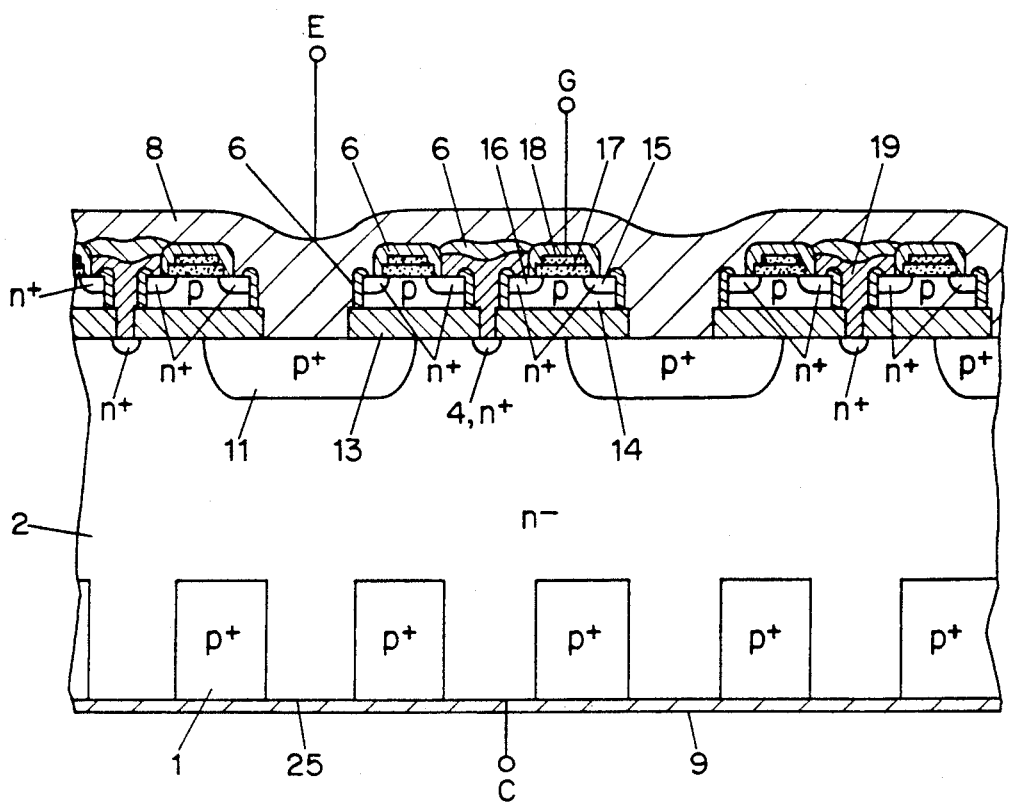

FIGS. 7, 8, and 9 respectively show structures of IGBTs having different embodiments of the present invention, in those Figs., the parts common to those of FIG. 1, have the same symbol is attached. In FIG. 7, alternating p+ layers 1 and n+ layers 23 are provided between the n− drift region 2 and the collector electrode 9. Since this n+ layer 23 is useful in pulling out majority carriers from the inside of the drift region 2 when the element has been turned off, a rapid switching speed is achieved.

In FIG. 8, the switching speed of element is increased by the inclusion of a buffer or region 24 between the n-drift region 2 and the p+ collector region 1.

In FIG. 9, by using Cr or Mo in the collector electrode 9 or by providing the p+ collector region 1 by forming an interval, a Schotky barrier 25 is formed between the collector electrode 9 and the n− drift region 2. Since the Schotky barrier injects minority carriers at large currents, it has the effect of decreasing the ON resistance.

Figure 3:
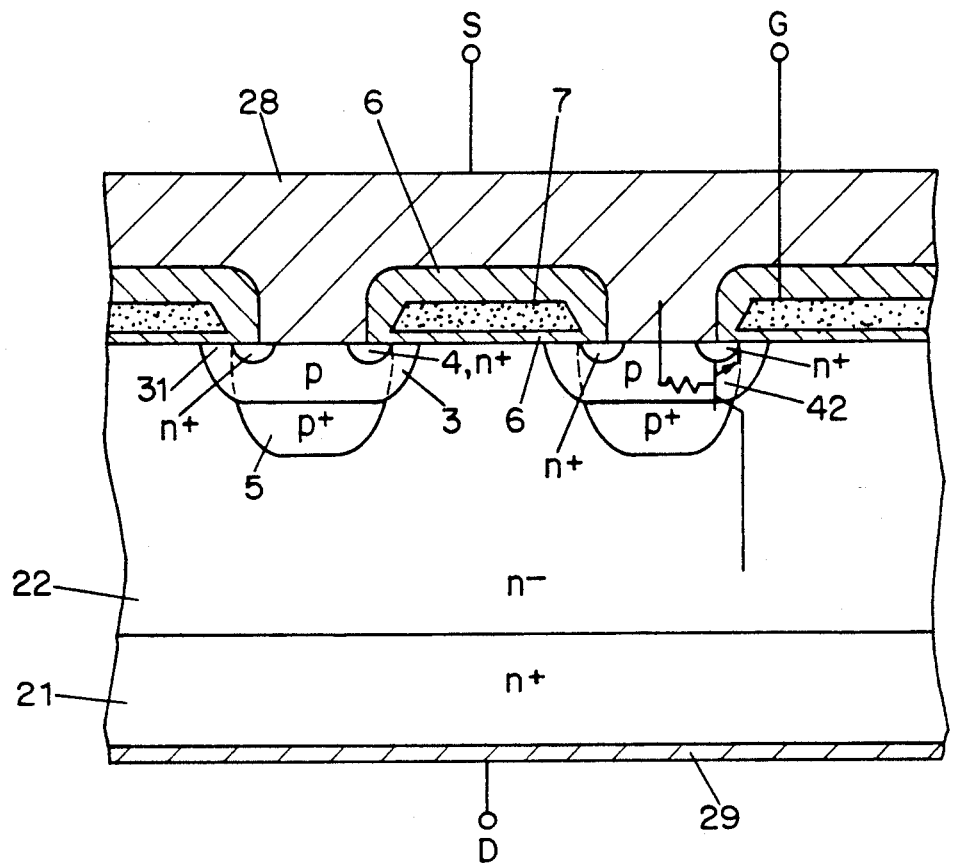
FIG. 3 is a sectional view of the essential part of a conventional power MOSFET.
Figure 4:
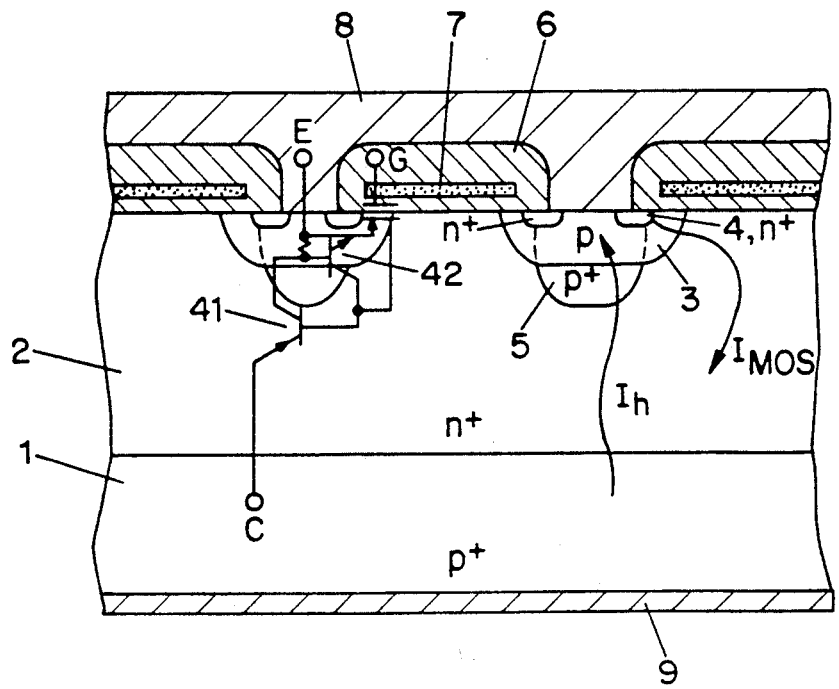
FIG. 4 is a sectional view in which the flow of the current in the IGBT of FIG. 2 and the equivalent circuit thereof have been depicted.
Figure 5:
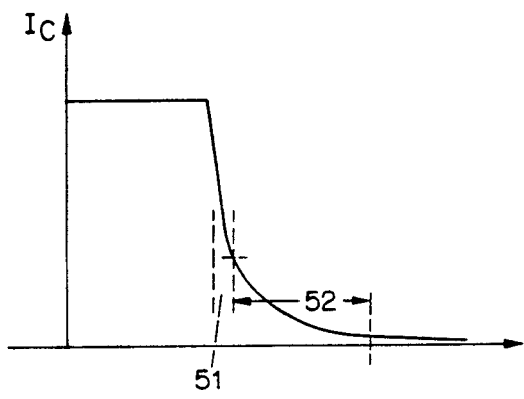
FIG. 5 is a damping waveform diagram of the collector current in the turned off time of the IGBT.
Figure 10:
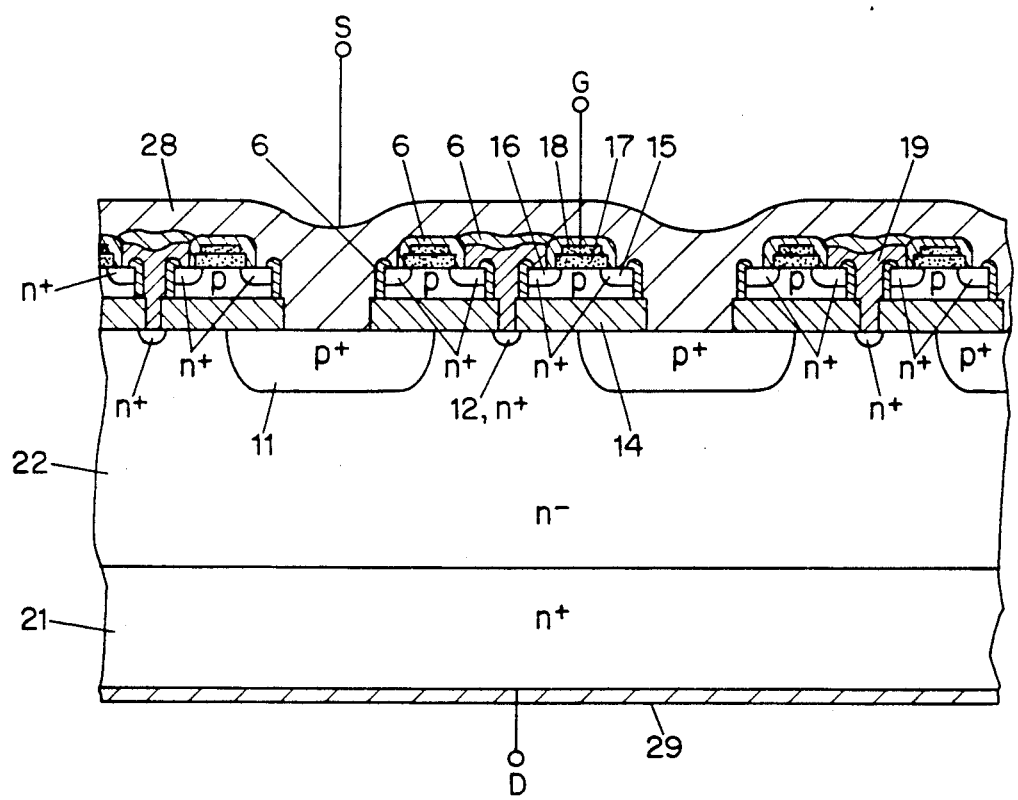
FIG. 10 is a sectional view of the essential part of the power MOSFET of an embodiment of the present invention.

FIG. 10 shows the embodiment of the present invention in a power MOSFET, and the parts common with those in FIG. 3 have common numbers. Also in this embodiment, the source region is not provided in the substrate. The p+ diffusion region 11 and n+ diffusion region 12 are provided on the substrate surface layer, and the MOSFET having a single crystal Si layer 14 is formed on the substrate. When ON, the electron current flows into the n− drift region 22 from the drain region 16 of the MOSFET. Thus, the main current flows between the source electrode 28 and the drain electrode 29. Since the parasitic transistor is not present in this structure, the latch back phenomenon cannot occur.

Although specific embodiments of the present invention have been illustrated and explained, it is easy to carry out many changes and variations other than the embodiments described above. For example, it is possible to reverse the conduction type of respective parts or to adopt different production methods for the MOSFET to be provided on the substrate.

I claim:

1. A metal oxide semiconductor device comprising:
   a semiconductor substrate having a semiconductor layer of a first conductivity type disposed thereon;
   a plurality of first regions of a second conductivity type different from said first conductivity type disposed on and embedded in a first surface of the semiconductor layer of the first conductivity type;
   a plurality of second regions of the first conductivity type having high impurity concentration disposed on the first surface of the semiconductor layer of the first conductivity type between adjacent ones of said first regions;

a plurality of MOSFET structures disposed on the surface of the semiconductor layer each structure comprising:

an insulating film disposed on the semiconductor layer of the first conductivity extending over portions of two of the first regions and having an opening aligned with the second region disposed between said two first regions;

a single crystal semiconductive layer of the second conductivity type disposed on the insulating film on both sides of the opening;

one or more source regions of the first conductivity type disposed on and embedded within a first surface of the single crystal semiconductor layer on either side of the opening near the edge of the single crystal layer remote from the opening;

one or more drain regions of the first conductivity type disposed on and embedded within the first surface of said single crystal semiconductive layer at a location closer to the opening than said source region;

a second insulating film disposed on the surface of the single crystal semiconductive layer and making contact with at least some portions of the single crystal semiconductive layer, the source region and the drain region while leaving portions of the source and drain regions exposed;

a gate electrode disposed on the insulating film;

a first electrode making electrical contact between the exposed portion of the drain region and the second region through the opening in the first insulating film; and a second electrode making electrical contact between the exposed portion of the source region and the first region.

2. A metal oxide semiconductor device as described in claim 1, wherein the semiconductor substrate comprises a semiconductive layer of the second conductivity type.

3. A metal oxide semiconductor device as described in claim 1, wherein the semiconductor substrate comprises an alternating array of n-type and p-type semiconductor regions along an axis parallel to the first surface of the semiconductor layer of the first conductivity type such that a second surface of the semiconductor layer of a first conductivity type makes contact with both of the alternating semiconductor types.

4. A metal oxide semiconductor device as described in claim 1, further comprising a Cr electrode layer disposed on a surface of the substrate opposite the semiconductive layer of the first conductivity type, wherein the Cr electrode forms a Schotky barrier and causes a reduction in the resistivity of the metal oxide semiconductive device.

5. A metal oxide semiconductor device as described in claim 1, further comprising a Mo electrode layer disposed on a surface of the substrate opposite the semiconductive layer of the first conductivity type, wherein the Mo electrode forms a Schotky barrier and reduces the resistivity of the metal oxide semiconductive device.

6. A metal oxide semiconductor device as described in claim 1, wherein the substrate comprises interval regions of a semiconductive material of the second conductivity type, wherein the interval regions form a Schotky barrier and reduces the resistivity of the metal oxide semiconductive device.

7. A metal oxide semiconductor device as described in claim 1, further comprising an intermediate semiconductive layer of the first conductivity type interposed between the semiconductor substrate and the semiconductive layer of a first conductivity type.

8. A metal oxide semiconductor device comprising:

a semiconductor substrate of the first conductivity type;

a plurality of first regions of a second conductivity type different from said first conductivity type disposed on and embedded in a first surface of the semiconductor substrate;

a plurality of second regions of the first conductivity type having high impurity concentration disposed on the first surface of the semiconductor substrate between adjacent ones of said first regions;

a plurality of MOSFET structures disposed on the surface of the semiconductor substrate comprising:

an insulating film disposed on the semiconductor substrate extending over portions of two of the first regions and having an opening aligned with the second region disposed between said two first regions;

a single crystal semiconductive layer of the second conductivity type disposed on the insulating film on both sides of the opening;

one or more source regions of the first conductivity type disposed on and embedded within a first surface of the single crystal semiconductor layer on either side of the opening near the edge of the single crystal layer remote from the opening;

one or more drain regions of the first conductivity type disposed on and embedded within the first surface of the single crystal semiconductive layer at a location closer to the opening than said source region;

a second insulating film disposed on the surface of the single crystal semiconductive layer and making contact with at least some portions of the single crystal semiconductive layer, the source region and the drain region while leaving portions of the source an drain regions exposed;

a gate electrode disposed on the insulating film;

a first electrode making electrical contact between the exposed portion of the drain region and the second region through the opening in the first insulating film; and a second electrode making electrical contact between the exposed portion of the source region and the first region.

* * * * *